United States Patent [19]

Tielert

[11] Patent Number: 4,740,924

[45] Date of Patent: Apr. 26, 1988

[54] CIRCUIT ARRANGEMENT COMPRISING A MATRIX-SHAPED MEMORY ARRANGEMENT FOR VARIABLY ADJUSTABLE TIME DELAY OF DIGITAL SIGNALS

[75] Inventor: Reinhard Tielert, Munich, Fed. Rep. of Germany

[73] Assignee: Siemens Aktiengesellschaft, Berlin and Munich, Fed. Rep. of Germany

[21] Appl. No.: 828,513

[22] Filed: Feb. 12, 1986

[30] Foreign Application Priority Data

Feb. 25, 1985 [DE] Fed. Rep. of Germany ....... 3506574

[51] Int. Cl.$^4$ .............................................. G11C 7/00
[52] U.S. Cl. .................................... 365/194; 365/189
[58] Field of Search ............... 365/189, 190, 194, 195, 365/196, 239, 240

[56] References Cited

U.S. PATENT DOCUMENTS 3,893,088 7/1975 Bell ...................................... 365/240

Primary Examiner—Joseph A. Popek
Attorney, Agent, or Firm—Hill, Van Santen, Steadman & Simpson

[57] ABSTRACT

A circuit arrangement for providing a variably adjustable time delay of digital signals comprises a matrix-shaped memory arrangement having storage elements with overlapping write/read cycles. A clock-controlled, continuously steppable row selector normally cyclically circulates, but can be reset at any time. The row selector comprises two mutually phase offset signal outputs per selection step which respectively drive a write word line and a read word line of a word of the matrix. Two separate bit lines, a write bit line and a read bit line, are provided per column and are respectively interconnected to all memory cells of a column. The data input for the data signal to be delayed is connectible to all write bit lines via gates individually assigned to the columns, whereby only one of m gates is activated at a time by the column selector.

4 Claims, 4 Drawing Sheets

CIRCUIT ARRANGEMENT COMPRISING A MATRIX-SHAPED MEMORY ARRANGEMENT FOR VARIABLY ADJUSTABLE TIME DELAY OF DIGITAL SIGNALS

CROSS REFERENCE TO RELATED APPLICATIONS

This application is related to application Ser. No. 831,791 filed Feb. 2, 1986 and application Ser. No. 828,512 filed Feb. 12, 1986.

BACKGROUND OF THE INVENTION

1. Field of the Invention

The present invention relates to a circuit arrangement for variably adjustable time delay of digital signals comprising a matrix-shaped memory arrangement.

2. Description of the Prior Art

Facilities for providing defined time delays of digital data streams are frequently required in the field of digital signal processing, as well as in the field of communications technology. Defined time delays are employed, for example, for the compensation of transit times. Given a constant number of desired delay clocks, an arrangement comprising a shift register is generally available as a time delay device. When, however, the time delay is to be variably adjustable, then particular problems arise given the use of shift registers.

It is also known in the art to delay data streams using an arrangement composed of standard circuits and memory modules. In such an arrangement, the components of the data stream are deposited in a freely addressable memory. This memory is driven by a decoder which is, in turn, driven by one (or more) counters. The duration of the time delay is thereby established by the spacing of the counter reset pulses. Since the memory cells of such freely addressable memories can only read or write, respectively, per clock, the necessity thereby arises of either operating the memories with twice the clock rate or switching back and forth between two memory units in a multiplex mode. The first solution of this problem is the disadvantage that the maximum data clock frequency can only be half as high as the maximum memory cycle frequency. The latter requires involved logic circuits for address control and a required reordering of the data. Disadvantages also arise for integration of such a circuit arrangement because of the high space requirement of the required multiplexers and because of the extensive wiring required.

SUMMARY OF THE INVENTION

The object of the present invention, therefore, is to provide a circuit arrangement of the type initially set forth by way of which defined, variably adjustable time delays can be achieved in fine graduations, which arrangement may be realized as an integrated circuit, and which has a smaller space requirement and allows higher data rates when compared to the arrangements known in the art. In particular, the object of the invention is comprised in creating a circuit arrangement which is particularly suited for integration in metal-oxide-semiconductor (MOS) technology.

According to the invention, the above object is achieved by providing a circuit arrangement for variably adjustable time delay of digital signals, the circuit arrangement comprising a matrix-shaped memory arrangement and being particularly characterized by the following features. First, known three-transistor cells having overlapping write/read cycles are provided as storage elements of the memory arrangement. A clock-controlled, continuously steppable row selector is provided and operates on a cyclic circulation principle, but can be reset at any time. The row selector comprises two respective signal outputs per selection step which are offset in phase with respect to one another and which drive a respective write word line or read word line which are provided per row of the matrix.

Two separate bit lines are provided per column, namely a write bit line and a read bit line, these being respectively interconnected to all memory cells of a column.

A disconnectible storage inverting amplifier is provided per column. The input of the amplifier is connected to the read bit line of the column assigned thereto and the output thereof is connected by way of a gate, dependent on the switch status thereof, either to the write bit line of the same column or to a data output. In the latter switch state, a data input is connected to the write bit line of the same column.

The data input for the data signals to be delayed is connectible to all write bit lines by way of the aforementioned gate circuits individually assigned to the columns, whereby only one of the m gate circuits is activated by way of a column selector which is controlled by a clock which is formed from the carry of the last stage of the row selector.

A reset line is connected to the setting inputs of a first element of a row selector and of a first element of the column selector, to the reset input of the remaining elements of the row selector and the reset inputs of the remaining elements of the column selector, as well as to the reset input of a counter which counts the pulses of the input data clock.

Finally, a reset signal for the reset line is acquired from a logic element to which an external reset signal is supplied via a first input and an external reset signal is supplied via a second input from a comparator. The comparator receives signals by way of selection inputs which define the number of steps of the counter after whose execution the reset signal is generated.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
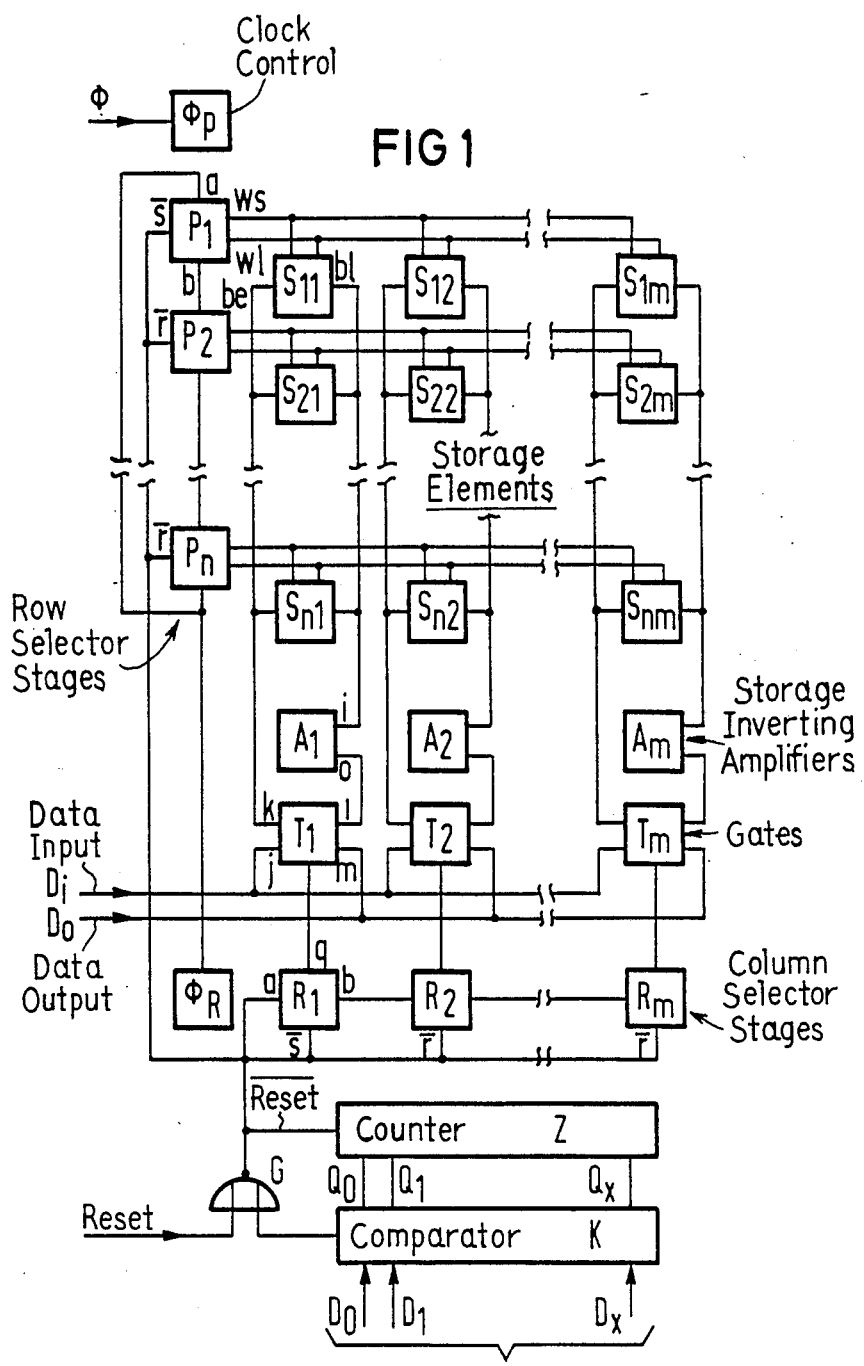
FIG. 1 is a block circuit diagram of a circuit arrangement constructed in accordance with a preferred embodiment of the invention in which a row selector, a matrix-shaped memory arrangement, regenerator circuits, a clock control, gate circuits, a column selector, a delay time setting device and a reset arrangement are provided.

As already explained, FIG. 1 illustrates a preferred exemplary embodiment of a circuit arrangement for variably adjustable time delay of digital signals comprising a matrix-shaped memory arrangement in accordance with the invention.

Figure 3:
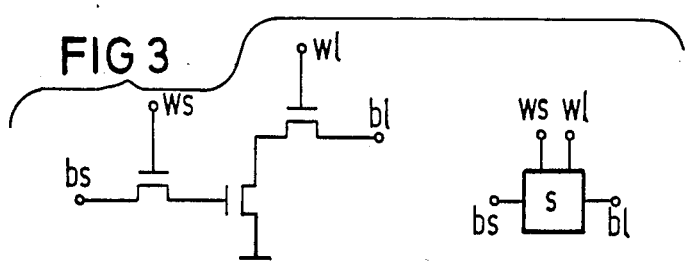
FIG. 3 is a symbolic representation contained in FIG. 1 and an equivalent circuit diagram of a three-transistor memory cell which is employed n×m fold in the memory arrangement of FIG. 1.

The illustrated circuit arrangement contains a data input $D_i$, a reset input $\overline{Reset}$, a clock input $\phi$ which synchronizes a clock control $\phi_P$, as well as a data output $D_o$. A cyclically circulating row selector comprising stages $P_1 \ldots P_n$ is also provided, wherein the stages and row selector are interconnected, the first stage $P_1$ having a setting input $\bar{s}$ and the remaining stages $P_2 \ldots P_n$ have respective reset inputs $\bar{r}$ connected to a reset line $\overline{Reset}$. A respective signal output b is connected to a signal input a of the following stage, and a write word line ws and a read word line wl are respectively provided per stage. Known three-transistor memory cells having overlapping write/read cycles are provided as storage elements in the matrix-shaped memory arrangement (cf. FIG. 3). The continuously steppable row selector $P_1 \ldots P_n$ which is resettable at any time is clocked-controlled by an input data clock. Per selection step, namely per stage, it comprises two signal outputs offset phase relative to one another (namely the write word line ws and the read word line wl, respectively) which are provided per row of the matrix. Two separate bit lines (a write bit line bs and a read bit line bl) are provided per column in the memory arrangement, these being respectively interconnected to all memory cells of a column. A disconnectable storage inverting amplifier $A_1 \ldots A_m$ is also provided per column, the input i thereof being connected to the read bit line bl of the column assigned thereto and the output o thereof being connected via a gate $T_1 \ldots T_m$ (depending on the switch state thereof) either to the write bit line bs of the same column or to the data output. A data input is connected to the write bit line of the same column in this latter switch state. The data input for the data signal to be delayed is connectible to all write bit lines bs via the gates $T_1 \ldots T_m$ individually assigned to the columns, whereby only one of the m gate circuits is activated by a column selector $R_1 \ldots R_m$. The column selector $R_1 \ldots R_m$ is controlled by a clock $\phi_R$ which is formed from the carry of the last stage $P_n$ of the row selector $P_1 \ldots P_n$. A reset line $\overline{Reset}$ is connected to setting inputs a, $\bar{s}$ of a first stage $P_1$ of the row selector and of a first element $R_1$ of the column selector, to the reset input $\bar{r}$ of the remaining elements $R_2 \ldots R_m$ of the column selector, as well as to the reset input $\bar{r}$ of a counter Z which counts off the pulses of the input data clock. A reset signal for the reset line $\overline{Reset}$ is acquired from a logic element G to which an external reset signal is supplied via a first input and to which an internal reset signal is supplied via a second input from a comparator K which receives signals via selection inputs $D_1 \ldots D_x$ which define the number of steps of the counter Z after whose execution the $\overline{Reset}$ signal is generated. The interval between the reset pulses corresponds to the required delay time.

Figure 2:
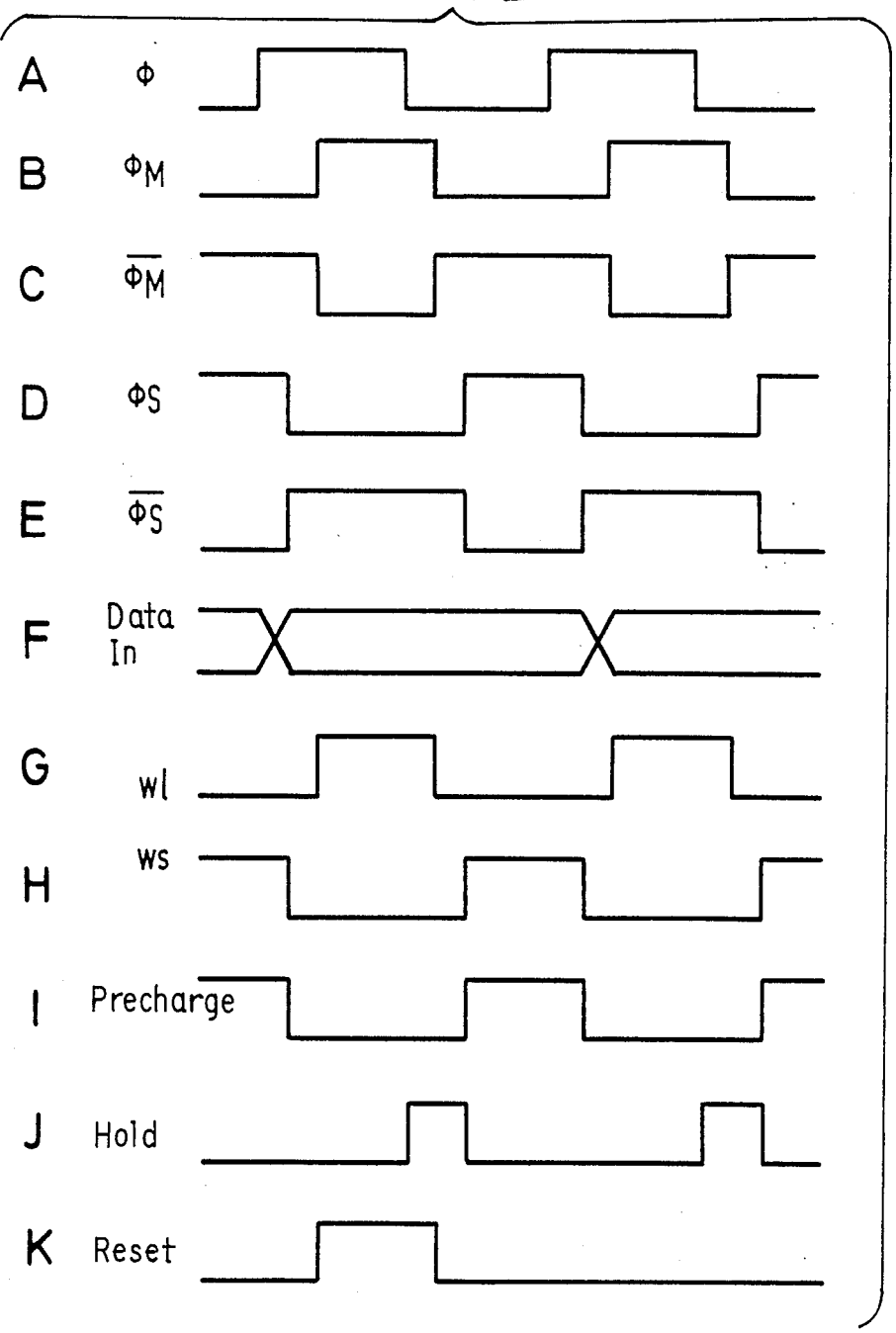
FIG. 2 is a pulse/time diagram for explaining the manner of operation of the circuit arrangement of FIG. 1.

As already set forth, FIG. 2 is a pulse/time diagram for explaining the operating mode of the circuit arrangement of the invention.

Figure 4:
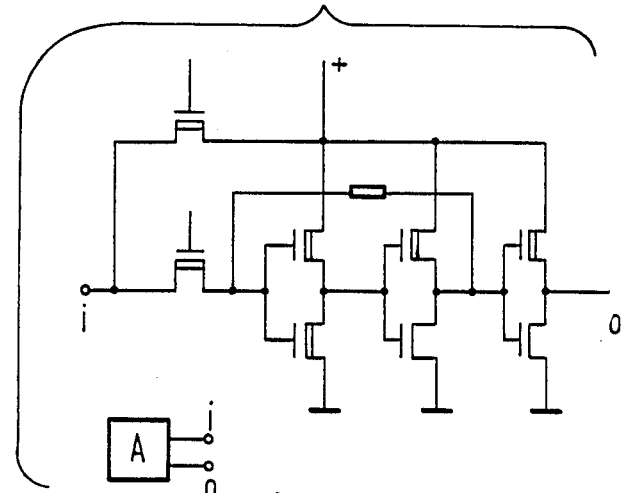
FIG. 4 is a symbolic representation contained in FIG. 1 of a regenerator (amplifier) and the equivalent circuit diagram thereof, such as employed m-fold in the circuit arrangement of FIG. 1.
Figure 5:
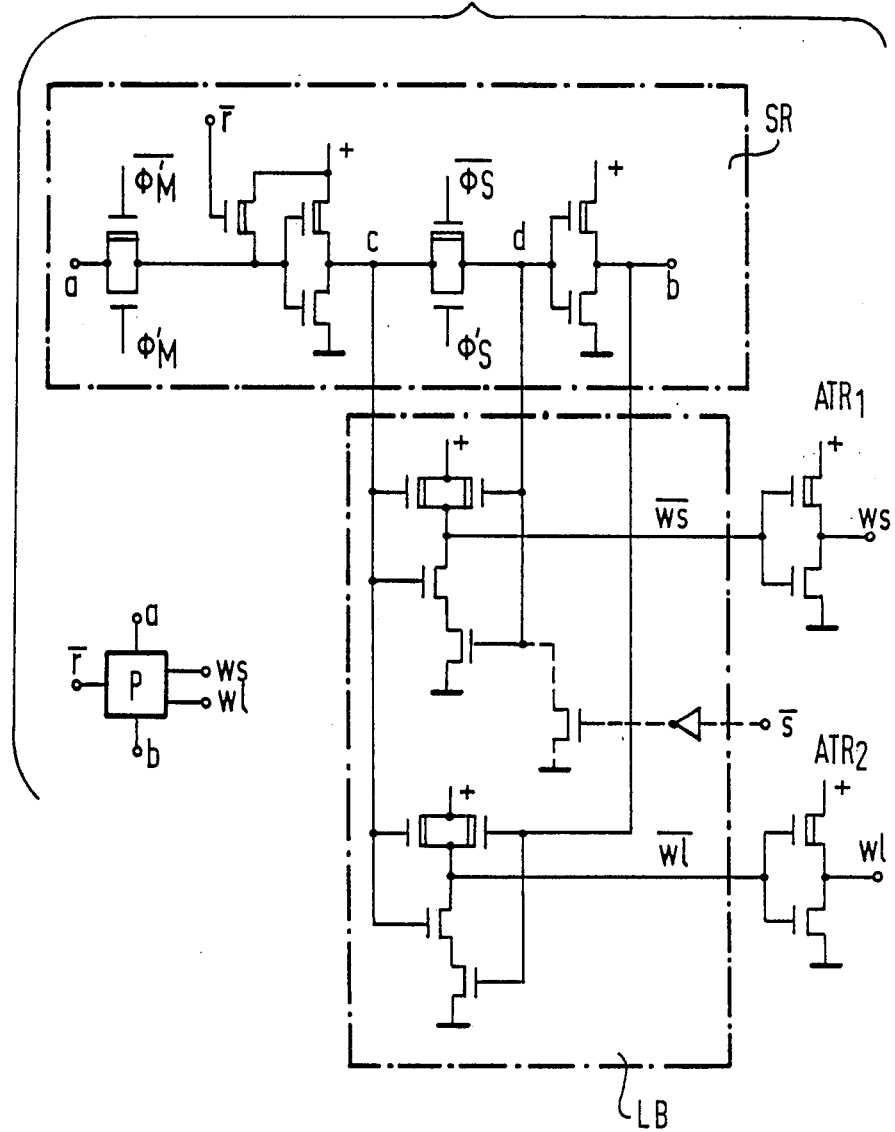
FIG. 5 is a symbolic representation employed in FIG. 1 for a row selector stage and the equivalent circuit diagram thereof, such stage being employed n-fold in the circuit arrangement of FIG. 1.

In FIG. 2, line A shows the basic clock $\phi$ applied to the clock control. Auxiliary clocks derive therefrom for the control of the row selector (cf. FIG. 5), namely $\phi_M$, $\phi_{M'}$, $\phi_S$ and $\overline{\phi_S}$ are shown in lines B, C, D and E, respectively. Line F shows the phase relation of the input data stream with reference to the basic clock $\phi$. Lines G and H show the output signals of the row selector, namely the read word signal wl and the write word signal ws. Lines I and J show a precharge signal and a hold signal, respectively, which are employed for the control of the regenerator (amplifier) circuits (cf. FIG. 4). Line K, finally, shows the phase relation of the required reset signal with respect to the basic clock $\phi$.

As mentioned above, FIG. 3 is a symbolic representation of a three-transistor memory cell along with its equivalent circuit, the principle of operation thereof being based on the fact that the information to be stored is dynamically stored at the gate of an MOS transistor (the middle of the three transistors). As indicated by the terminal designations, this known three-transistor memory cell is employed in a specific operating mode wherein separate bit lines are used for reading and writing (cf. FIG. 1), whereby the possibility arises of reading and writing in a single clock cycle, this advantageously leading to the desired saving of time.

As also mentioned above, FIG. 4 is an illustration of an amplifier or regenerator shown both symbolically and in an equivalent circuit diagram. The job of the regenerator is to amplify the read signal appearing attenuated on the read bit line bl assigned to its input i, amplifying the same to a standard level and emitting the amplified signal to the output o. The circuit of this regenerator contains a three-stage inverter arrangement comprising a regeneration path therein. The inverter arrangement is preceded by a switch (controlled by the hold signal) which disconnects the inverter arrangement from the input i whenever the read bit line is precharged for the next clock cycle and thereby retains the stored information. The precharging is thereby effected by a further switch controlled by the $\overline{Precharge}$ signal.

In accordance with an advantageous feature of the invention, the circuit arrangement shown in FIG. 1 can be multiply provided in accordance with the word width of the input data, whereby the word write line ws and the word read line wl, respectively, of these memory matrices are connected in parallel and are connected to a row selector $P_O \ldots P_n$ provided in common for the matrices. Further, the column selector which controls the gates can be arranged in common for these memory matrices.

Another feature of the invention is that the row selector $P_1 \ldots P_n$ are respectively composed of a shift register SR, of a logic block LB and of two output drivers $ATR_1$ and $ATR_2$ having outputs ws or wl, respectively per element of the row selector, and that the phase relations and pulse widths of the output signals in the outputs ws and wl are effected by corresponding logic combinations of three taps present in the shift register SR.

As mentioned above, FIG. 5 shows a row selector stage P. Two dynamic register stages which can be separated from one another or, respectively, from the signal input by switches controlled with the assistance of auxiliary clocks $\overline{\phi'_M}$, $\phi'_M$, $\overline{\phi_S}$, $\phi_S$ are provided in a shift register block SR. The auxiliary clocks $\overline{\phi'_M}$ and $\phi'_M$ correspond to the auxiliary clocks $\overline{\phi_M}$ and $\phi_M$ of FIG. 2. However, they represent result signals of a logic operation of the appertaining signal shown in FIG. 2 with the reset signal. This logic operation effects a closing of the switch at the input of the switch register block SR for the duration of the reset signal. Two logic elements are provided in a logic block LB, these logic elements combining the signals appearing at the point c, d, b with one another in accordance with the following relationships $$\overline{ws} = \overline{c} \, d; \text{ and}$$

$$\overline{wl} = \overline{c} \, \overline{b}.$$

The output signals $\overline{ws}$ and $\overline{wl}$ of the logic block LB are connected via inverting drivers to the write word line ws or, respectively, to the read word line of the appertaining row of the matrix-shaped memory arrangement. A respective reset signal $\overline{r}$ is provided for the stages $P_2 \ldots P_n$ of the row selector of FIG. 1. This is replaced at the stage $P_1$ by a setting input $\overline{s}$ as indicated with broken lines in FIG. 5.

Figure 6:
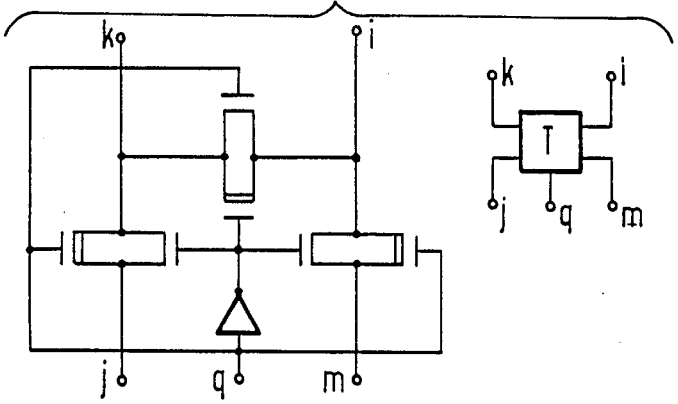
FIG. 6 is a symbolic representation employed in FIG. 1 for a gate circuit, along with an equivalent circuit diagram thereof, the gate circuit being employed m-fold in the circuit arrangement of FIG. 1.

As already set forth above, FIG. 6 shows the structure of one of the m gate circuits T which provide the following functions:

$$q = 0: m = l, k = j; \text{ and}$$

$$q = 1: m = z, k = l,$$

where "z" is indifferent.

The column selector $R_1 \ldots R_2$ is preferably realized as a series arrangement comprising static shift registers, whereby the shift registers are switched by a phase clock derived from the clock signal $\phi_R$.

Based on its structure, a circuit arrangement constructed in accordance with the present invention is particularly suited for realization as a monolithically integrated MOS circuit.

Although I have described my invention by reference to a particular exemplary embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for providing a variably adjustable time delay for a data stream of digital signals, comprising:
   a memory matrix including a plurality of storage elements arranged in columns and rows, each of said storage elements comprising a three-transistor cell having overlapping write/read cycles, a separate write bit line and a separate read bit line for each column respectively connected to each cell of the respective column, and a separate write word line and a separate read word line for each row respectively connected to each cell of the respective row;
   a reset control signal input for receiving a reset control signal;
   a continuously steppable clock row selector including a plurality (1−n) of cascaded selector stages each including two mutually offset signal outputs respectively connected to a respective write word line and a respective read word line and each including a control input connected to said reset control signal input for receiving a reset control signal at an arbitrary time for setting the first stage and resetting all other stages of said row selector;
   a data input for receiving an input data stream to be delayed;
   a data output for delivering a delayed data stream;
   a plurality of gate circuits each connected to said data input and to said data output;
   a plurality of amplifiers each assigned to a respective column and including an input connected to the respective read bit line of the respective column and an output connected to a respective gate circuit and selectively connectible by the respective gate circuit to the respective write bit line in one gate circuit state and to said data output in an opposite switch state of the respective gate circuit at which time the data input is connected to the write bit line of the respective column;
   a continuously steppable column selector including a plurality (1−m) of column selector stages each connected to a respective gate circuit;
   column control clock means connected between the last row selector stage (n) and said column selector stages to produce clock pulses in response to a carry from the last row selector stage so that said column selector stages activate said gate circuits one at a time;
   a counter for counting pulses of a input data clock;
   a comparator connected to said counter and including inputs for receiving signals defining the number of counts of said counter before generating an internal reset signal;
   a first reset input connected to said reset control signal inputs of said row selector stages and to said counter;
   an external reset input for receiving an external reset signal; and
   gate means including a first input connected to said comparator and a second input connected to said external reset input and an output connected to said reset control signal input for producing the reset control signal after the defined number of counts.

2. The circuit arrangement of claim 1, and further comprising:
   a plurality of said memory matrices, said plurality of amplifiers and said plurality of gate circuits, with said word and bit lines connected in parallel and connected in common with said row selector, and said gate circuits connected in common with said column selector.

3. The circuit arrangement of claim 1, wherein:
   said circuit arrangement is a monolithically integrated metal-oxide-semiconductor circuit.

4. The circuit arrangement of claim 1, wherein:
   said row selector comprises a shift register in which each selector stage comprises a shift register stage having three taps and a logic block connected to said three taps and a logic block connected to said three taps to logically combine signals thereat for the respective write word line and the respective read word line.

* * * * *